United States Patent
Vig et al.

[11] Patent Number: 5,512,863
[45] Date of Patent: Apr. 30, 1996

[54] METHOD OF MINIMIZING THE AGING AND RADIATION INDUCED FREQUENCY SHIFTS OF QUARTZ OSCILLATORS

[75] Inventors: John R. Vig, Colts Neck; Vincent J. Rosati, Oakhurst, both of N.J.

[73] Assignee: The United States of America as represented by the Secretary of the Army, Washington, D.C.

[21] Appl. No.: 764,448

[22] Filed: Aug. 12, 1985

[51] Int. Cl.$^6$ .................................................. H03B 5/32
[52] U.S. Cl. ............................................ 331/158; 331/160
[58] Field of Search ...................................... 331/158, 160

[56] References Cited

U.S. PATENT DOCUMENTS

| | | | |
|---|---|---|---|
| 1,763,515 | 6/1930 | Hahnemann | 331/160 |
| 1,919,993 | 7/1933 | Tripp | 331/160 |
| 3,596,206 | 7/1971 | Loria | 331/158 X |
| 3,875,533 | 4/1975 | Irwin et al. | 331/158 X |
| 4,560,956 | 12/1985 | Duncan | 331/158 X |
| 4,591,807 | 5/1986 | Davis | 331/158 X |

Primary Examiner—Mark Hellner
Attorney, Agent, or Firm—Michael Zelenka; Roy E. Gordon

[57] ABSTRACT

The aging and radiation induced frequency shifts of quartz crystal oscillators are minimized by using oscillator circuits in which the DC voltage applied to the quartz crystal is about zero. This results in reduced movement of impurity ions which generally cause such shifts.

2 Claims, 1 Drawing Sheet

METHOD OF MINIMIZING THE AGING AND RADIATION INDUCED FREQUENCY SHIFTS OF QUARTZ OSCILLATORS

The invention described herein may be manufactured, used and licensed by or for the Government for governmental purposes without the payment to us of any royalty thereon.

This invention relates in general to a method of improving quartz crystal resonators and in particular to a method of minimizing the aging and radiation induced frequency shifts of quartz crystal oscillators, and to apparatus for minimizing the aging and radiation induced frequency shifts of quartz crystal oscillators.

BACKGROUND OF THE INVENTION

It is well known that the frequencies of even the best available crystal oscillators change with time, i.e., all crystal oscillators manifest the phenomenon known as "aging". Also, when irradiated with ionizing radiation (e.g., X-rays, γ-rays, electrons), crystal oscillators change frequency. The amount of radiation induced frequency change, especially at high doses, is known to depend on the purity of the quartz material. The aging of crystal oscillators is generally attributed to phenomena such as mass transfer due to contamination and stress relief.

In order to obtain low aging in crystal oscillators, the "recipe" typically consists of ultraclean processing of the resonator including a high temperature vacuum bake prior to sealing, a mounting structure that is not subject to stress relief, gold electrodes, and a Pierce-type oscillator circuit with automatic gain control and constructed of components selected for high stability. In order to obtain maximum resistance to radiation induced frequency shifts, the "recipe" consists primarily of using swept cultured quartz and oscillator components that are relatively immune to radiation induced changes. "Sweeping" involves heating the quartz, typically to about 500° C., while applying an electric field along the Z crystallographic direction. The strength of the field is typically 1000 V per cm.

In the oscillator circuitry, there is nearly always a small DC voltage applied to the crystal unit due to the bias voltages applied to the transistors in the oscillator circuitry. In the past, this DC voltage was thought to be inconsequential. Also in the past, sweeping to any significant degree was thought to occur only at high temperatures and electric fields.

It has now been found that when a small voltage is applied to a resonator at the normal operating temperatures of oscillators, the aging rate increases significantly. The increase in initial aging rate is significantly higher for resonators made of natural quartz than for those made of the much higher purity swept cultured quartz. It has also been found that when a resonator is irradiated with a pulse of ionizing radiation, the frequency shifts and the conductivity of the quartz plate increase significantly. Immediately after the pulse, conductivity increases as high as a factor of $10^{11}$ have been observed. The conductivity increase is generally attributed to the liberation of alkali impurity ions in the quartz. The higher the alkali impurity level, the higher the conductivity increase. The radiation induced frequency shifts are also known to be associated with the presence of alkali impurities in the quartz.

SUMMARY OF THE INVENTION

The general object of this invention is to provide a method of improving quartz crystal oscillators. A more specific object of the invention is to provide such a method in which the aging and radiation induced frequency shifts of the quartz crystal oscillators are minimized. A still further object of the invention is to provide such a method wherein the improved quartz crystal oscillator will find valued use for clocks and frequency standards. Another object of the invention is to provide such a method wherein the improved quartz crystal oscillator will find use in space oriented systems.

It has now been found that the aforementioned objects can be attained using oscillator circuits in which the DC voltage applied to the crystal is zero or very nearly zero.

The method is believed to work for the following reason. When there is a DC voltage across the crystal, the electric-field-caused forces can free the weakly bound impurity ions, such as $Na^+$, in the crystal and cause these ions to move towards the negatively charged electrode of the quartz crystal. The migration of the ions causes a shift in the elastic constants of quartz, which in turn produces a frequency shift, i.e. it produces aging. When the crystal is exposed to a pulse of ionizing radiation, then even the more strongly bound impurity ions are freed from their lattice sites. When there is a DC voltage across the crystal, impurity ions such as $Na^+$, $K^+$, $Li^+$ and $H^+$ will move preferentially toward the cathode. This preferential movement of ions will result in a change in the elastic constants of quartz and thus result in a frequency shift. On the other hand, if the voltage across the crystal is zero, then the impurity ions will either not migrate at all or migrate in random directions, thus causing a much smaller change in the elastic constants of quartz i.e. a much smaller frequency shift.

It has now been found that when the radiation responses of two resonators are measured with and without a DC voltage on the resonators, even when the resonators are exposed to steady state radiation, the initial radiation induced frequency shifts are much larger when the DC voltage is present during irradiation. Also the frequency changes anneal much more rapidly, for several hours subsequent to the completion of irradiation, when the DC voltage is present. That is, both during and subsequent to irradiation, the frequency stabilities of resonators are far superior when there is no DC voltage present on the resonators.

DESCRIPTION OF THE DRAWING

Referring to FIG. 1, the quartz crystal resonator 10 is the principal frequency determining element of the oscillator. The quartz crystal resonator 10 is electrically connected to one side of the load capacitor 12 which is used to fine tune the output frequency of the oscillator and to one end of the primary winding of the transformer primary winding. The secondary winding of the transformer 14 is connected to the remaining oscillator circuit elements generally designated 16. A resonator excitation signal generated by the remaining oscillator circuit elements 16 is coupled through the transformer 14 and load capacitor 12 to the resonator 10 with no direct voltage applied.

Referring to FIG. 2, the remaining oscillator circuit elements 16 generate an excitation voltage and a positive DC voltage, +V, that appears across the quartz crystal resonator 10. A separate DC source 18 applies an equal and opposite negative DC voltage, −V, to the quartz crystal resonator 10 such that the total voltage across the quartz crystal resonator 10 is zero.

Referring to FIG. 3, the remaining oscillator circuit elements 16 apply an excitation voltage to the quartz crystal resonator 10. The load capacitors 12 and 12' of substantially equal value are connected in series with opposite sides of the quartz crystal resonator 10 and are used to couple the excitation to the quartz crystal resonator 10 and to fine adjust the output frequency of the remaining oscillator circuit elements 16. Shunt resistor 20 is connected in parallel with the quartz crystal resonator 10 and is used to minimize the DC voltage across the quartz crystal resonator 10 without degrading the Q of the resonator.

In FIG. 1, 10 is the quartz crystal resonator, 14 is the transformer through which the rf signal is coupled to the quartz crystal resonator, 12 is a load capacitor, and 16 is the remaining oscillator circuit elements which are conventional.

In FIG. 2, 10 is the quartz crystal resonator, 18 is a source of DC voltage, and 16 is the remaining oscillator circuit elements which are conventional.

In FIG. 3, 10 is the quartz crystal resonator, 12 and 12' are load capacitors, 20 is a shunt resistor, and 16 is the conventional remaining oscillator circuit elements which are conventional.

Figure 1:
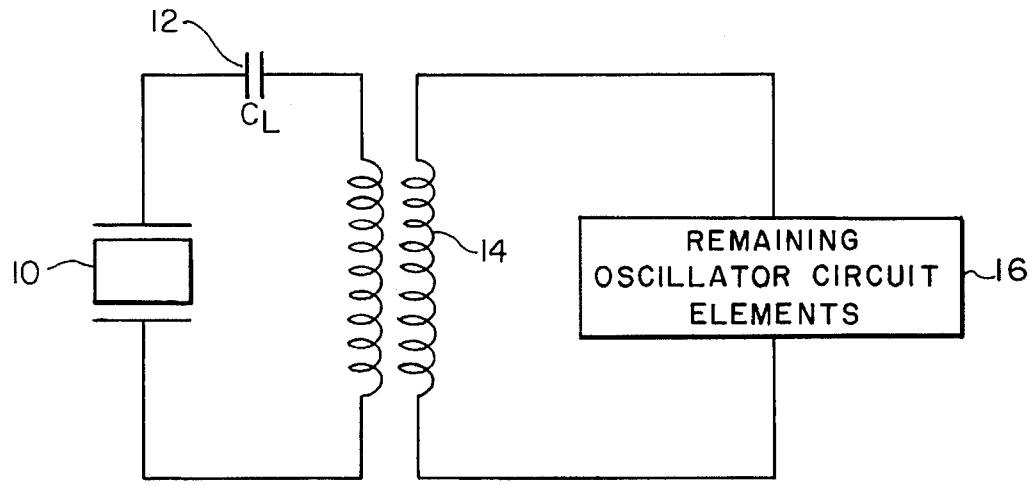
FIG. 1 shows the use of transformer coupling to the quartz crystal resonator in which the DC voltage on the quartz crystal resonator is exactly zero.
Figure 2:
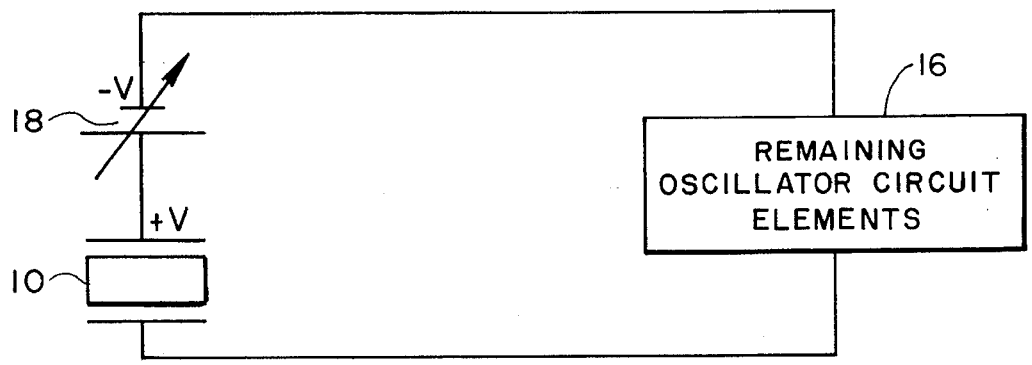
FIG. 2 shows the use of a conventional oscillator circuit wherein the DC voltage across the quartz crystal resonator is measured and an equal DC voltage of opposite sign is applied in series with the quartz crystal resonator.
Figure 3:
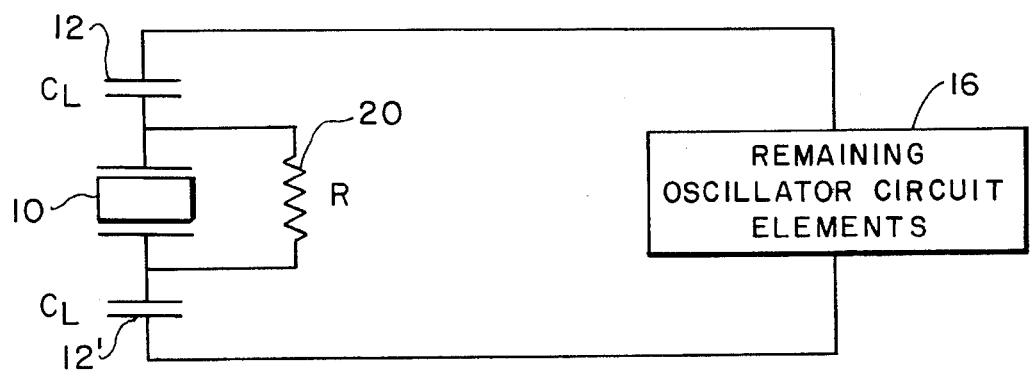
FIG. 3 shows a circuit with load capacitors, $C_L$, and a shunt resistor, R.

In the circuit of FIG. 3, the voltage across the quartz crystal resonator 10 is minimized, without significantly degrading the Q of the crystal, by selecting the resistance R of the shunt resistor 20 to be much larger than the equivalent series resistance of the quartz crystal resonator 10, and by selecting the combined DC resistance of the two CL's to be much larger than R.

For example, if the equivalent series resistance of the quartz crystal resonator 10 is 100 ohms, R is chosen to be $10^7$ ohms and the DC resistance of the two load capacitors is $10^{11}$ ohms, then the Q of the quartz crystal resonator 10 is effected by a negligible amount, and the voltage across the quartz crystal resonator 10 is reduced by about a factor of $10^4$ from what it would be without the shunt resistor 20 across the crystal. That is, if without the shunt resistor 20 the remaining oscillator circuit 16 elements apply 2 V, then, with the shunt resistor 20 in place, the DC voltage across the quartz crystal resonator 10 direct voltage to the quartz crystal resonator 10, is reduced to less than 1 millivolt. Such a small voltage should have a negligible effect on the movement of impurity ions in quartz.

An alternative embodiment similar to the one shown in FIG. 3 is to eliminate one of the load capacitors, CL, in FIG. 3.

Other embodiments will be readily apparent to those well versed in the art of oscillator design.

We wish it to be understood that we do not desire to be limited to the exact details as described for obvious modifications will occur to a person skilled in the art.

What is claimed is:

1. Method of minimizing the aging and radiation induced frequency shifts of quartz crystal oscillators comprising coupling a quartz crystal to an oscillator circuit, measuring the DC voltage applied by the oscillator across the crystal, and applying an equal DC voltage of opposite sign to the crystal thereby causing the DC voltage applied to the crystal by the oscillator to be about zero.

2. Apparatus for minimizing the aging and radiation induced frequency shifts of quartz crystal oscillators, said apparatus comprising an oscillator circuit including a quartz crystal resonator and means for coupling said quartz crystal resonator to the remaining oscillator circuit elements with a substantially zero DC voltage applied to said quartz crystal resonator, said means for coupling including a pair of capacitors, each connected in series between said remaining oscillator circuit elements and respective opposite sides of said quartz crystal resonator, and a shunt resistor connected across said opposite sides of said quartz crystal resonator, said shunt resistor having a resistance much larger than the equivalent series resistance of said quartz crystal resonator and the combined DC resistance of said pair of capacitors being much larger than that of said shunt resistor.

* * * * *